United States Patent
Aslanov et al.

(10) Patent No.: US 10,403,499 B2
(45) Date of Patent: Sep. 3, 2019

(54) LASER POLYCRYSTALLIZATION APPARATUS

(71) Applicant: SAMSUNG DISPLAY CO., LTD., Yongin-si, Gyeonggi-Do (KR)

(72) Inventors: Emil Aslanov, Asan-si (KR); Jekil Ryu, Yongin-si (KR); Haesook Lee, Hwaseong-si (KR); Gyoowan Han, Yongin-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 15/848,086

(22) Filed: Dec. 20, 2017

(65) Prior Publication Data

US 2018/0174836 A1    Jun. 21, 2018

(30) Foreign Application Priority Data

Dec. 21, 2016    (KR) .................. 10-2016-0175628

(51) Int. Cl.
*H01L 21/02*    (2006.01)
*H01L 21/268*    (2006.01)
(Continued)

(52) U.S. Cl.
CPC .... *H01L 21/02675* (2013.01); *B23K 26/0608* (2013.01); *B23K 26/0648* (2013.01);
(Continued)

(58) Field of Classification Search
CPC ............................................. H01L 21/02675
See application file for complete search history.

(56) References Cited

U.S. PATENT DOCUMENTS

| 5,815,494 A * | 9/1998 | Yamazaki | .......... | B23K 26/0738 |
| | | | | 372/25 |
| 6,038,075 A * | 3/2000 | Yamazaki | .......... | B23K 26/0604 |
| | | | | 359/626 |

(Continued)

FOREIGN PATENT DOCUMENTS

| CN | 105932545 | 9/2016 |
| DE | 10345177 | 10/2004 |

(Continued)

OTHER PUBLICATIONS

European Search Report issued in corresponding application No. 17208649.8 dated Aug. 23, 2018.

*Primary Examiner* — William Coleman
(74) *Attorney, Agent, or Firm* — F. Chau & Associates, LLC

(57) ABSTRACT

A laser polycrystallization apparatus including: a light source for emitting a laser beam; a diffraction grating for receiving the laser beam from the light source, changing a path and a magnitude of the received laser beam, and outputting the changed laser beam; a light split portion for splitting the laser beam received from the diffraction grating; and a light superposition portion for superposing the split laser beams received from the light split portion and irradiating the superposed split laser beams to a substrate. An angle between the laser beam irradiated to an incidence surface of the diffraction grating from the light source and a line substantially perpendicular to an emission surface of the diffraction grating is an acute angle.

22 Claims, 5 Drawing Sheets

(51) Int. Cl.

| | | |
|---|---|---|
| *H01L 29/66* | (2006.01) | |
| *H01L 29/786* | (2006.01) | |
| *B23K 26/06* | (2014.01) | |
| *H01L 27/12* | (2006.01) | |
| *H01S 5/00* | (2006.01) | |
| *H01J 29/46* | (2006.01) | |
| *H01J 9/24* | (2006.01) | |
| *H01S 5/40* | (2006.01) | |
| *B23K 26/067* | (2006.01) | |
| *B23K 103/00* | (2006.01) | |

(52) U.S. Cl.
CPC .......... *B23K 26/0676* (2013.01); *H01J 9/241* (2013.01); *H01J 29/467* (2013.01); *H01L 21/02532* (2013.01); *H01L 21/02595* (2013.01); *H01L 21/02678* (2013.01); *H01L 21/268* (2013.01); *H01L 27/1277* (2013.01); *H01L 29/6675* (2013.01); *H01L 29/78672* (2013.01); *H01S 5/005* (2013.01); *H01S 5/4012* (2013.01); *B23K 2103/56* (2018.08)

(56) References Cited

U.S. PATENT DOCUMENTS

| | | | |
|---|---|---|---|
| 6,590,921 B2 | 7/2003 | Tada et al. | |
| 6,650,480 B2* | 11/2003 | Tanaka | B23K 26/0604 359/618 |
| 6,665,471 B1* | 12/2003 | Farmer | H01S 5/4062 372/102 |
| 6,678,037 B2 | 1/2004 | Van Elp et al. | |
| 6,800,237 B1 | 10/2004 | Yamamoto et al. | |
| 7,566,669 B2* | 7/2009 | Tanaka | H01L 21/2026 438/795 |
| 7,595,932 B2* | 9/2009 | Tanaka | B23K 15/0093 359/623 |
| 7,596,070 B2 | 9/2009 | Dambach et al. | |
| 7,662,703 B2* | 2/2010 | Moriwaka | H01L 21/02532 438/166 |
| 7,924,684 B2* | 4/2011 | Kaneda | G11B 7/1275 369/112.12 |
| 8,012,841 B2* | 9/2011 | Nishida | B23K 26/0608 257/E21.134 |
| 8,432,613 B2* | 4/2013 | Jennings | B23K 26/0648 359/626 |
| 8,455,790 B2* | 6/2013 | Tanaka | B23K 26/066 219/121.65 |
| 8,902,506 B2 | 12/2014 | Mizuyama et al. | |
| 2008/0084605 A1 | 4/2008 | Rothenberg et al. | |
| 2015/0229099 A1* | 8/2015 | Tayebati | H01S 5/0687 372/32 |
| 2018/0174836 A1* | 6/2018 | Aslanov | H01S 5/005 |

FOREIGN PATENT DOCUMENTS

| | | |
|---|---|---|
| KR | 2002-0028806 | 4/2002 |
| KR | 10-0505087 | 7/2005 |
| KR | 10-0714381 | 5/2007 |
| KR | 10-2010-0110754 | 10/2010 |

* cited by examiner

LASER POLYCRYSTALLIZATION APPARATUS

CROSS-REFERENCE TO RELATED APPLICATION

This application claims priority under 35 U.S.C. § 119 to Korean Patent Application No. 10-2016-0175628, filed on Dec. 21, 2016 in the Korean Intellectual Property Office (KIPO), the disclosure of which is incorporated by reference herein in its entirety.

TECHNICAL FIELD

Exemplary Embodiments of the present invention relate to a laser apparatus, and more particularly, to a laser polycrystallization apparatus for a display device including a diffraction grating.

DISCUSSION OF THE RELATED ART

In general, an organic light emitting diode ("OLED") display device, a liquid crystal display ("LCD") device, or the like controls light emission or the intensity of light emission of each pixel by using a thin film transistor ("TFT"). Generally, a TFT includes a semiconductor layer, a gate electrode, a source electrode, and a drain electrode. Typically, polysilicon that is crystallized from amorphous silicon is used as the semiconductor layer in the TFT.

In a method of manufacturing a TFT substrate embedded with the TFT or a display device including the TFT substrate, an amorphous silicon (a-Si) layer may be formed on a substrate and crystallized into polysilicon (P-Si), and thus, the TFT substrate or the display device including the TFT substrate may be manufactured. In this case a laser beam may be irradiated to the amorphous silicon to crystallize the amorphous silicon to polysilicon.

SUMMARY

According to an exemplary embodiment of the present invention, a laser polycrystallization apparatus includes: a light source for emitting a laser beam; a diffraction grating for receiving the laser beam from the light source, changing a path and a magnitude of the received laser beam, and outputting the changed laser beam; a light split portion for splitting the laser beam received from the diffraction grating; and a light superposition portion for superposing the split laser beams received from the light split portion and irradiating the superposed split laser beams to a substrate. An angle between the laser beam irradiated to an incidence surface of the diffraction grating from the light source and a line substantially perpendicular to an emission surface of the diffraction grating is an acute angle.

The angle may be in about 5 degrees to about 65 degrees.

A diffraction angle of the diffraction grating may be about 0 degrees.

A wavelength of the laser beam emitted from the light source may be about 343 nm.

The light split portion may include: a first lens array located between the diffraction grating and the light superposition portion and including a plurality of first lenses, each of the first lenses having a semi-cylindrical shape; and a second lens array located between the first lens array and the light superposition portion and including a plurality of second lenses, each of the second lenses having a semi-cylindrical shape.

A distance between the diffraction grating and the first lens array may be about 100 mm to about 1000 mm.

A distance between the first lens array and the second lens array may be about 135 mm.

A first lens of the plurality of first lenses may have a thickness of about 3 mm and a radius of curvature of about 110.8 mm.

A second lens of the plurality of second lenses may have a thickness of about 3 mm and a radius of curvature of about 25.7 mm.

The first lens array, the second lens array, or the diffraction grating may include fused silica.

The light superposition portion may include at least one condensing lens.

The light superposition portion may include: a first condensing lens located between the light split portion and the substrate; and a second condensing lens located between the first condensing lens and the substrate.

An emission surface of the first condensing lens and an incidence surface of the second condensing lens may be convex.

A distance between the first condensing lens and the second condensing lens may be about 14,000 mm.

A distance between the second condensing lens and the substrate may be about 500 mm.

The first condensing lens may have a thickness of about 40 mm and a radius of curvature of about 6,822 mm.

The second condensing lens may have a thickness of about 50 mm and a radius of curvature of about 6,822 mm.

The first condensing lens or the second condensing lens may include fused silica.

The diffraction grating may be a blazed transmission grating.

According to an exemplary embodiment of the present invention, a laser polycrystallization apparatus includes: a light source; a diffraction grating including a plurality of gratings, each grating having a triangular shape; a first lens array including a plurality of first lenses; a second lens array including a plurality of second lenses. The first lens array is disposed between the second lens array and the diffraction grating. The laser polycrystallization apparatus further includes a first condensing lens including an emission surface with a convex shape; and a second condensing lens including an incidence surface with a convex shape. The incidence surface of the second condensing lens faces the emission surface of the first condensing lens.

Each first lens of the plurality of first lenses has a first radius of curvature, and each second lens of the plurality of second lenses has a second radius of curvature. The first radius of curvature is larger than the second radius of curvature.

BRIEF DESCRIPTION OF THE DRAWINGS

The above and other features of the present invention will be more clearly understood by describing in detail exemplary embodiments thereof with reference to the accompanying drawings, in which.

DETAILED DESCRIPTION OF THE EMBODIMENTS

Figure 1:
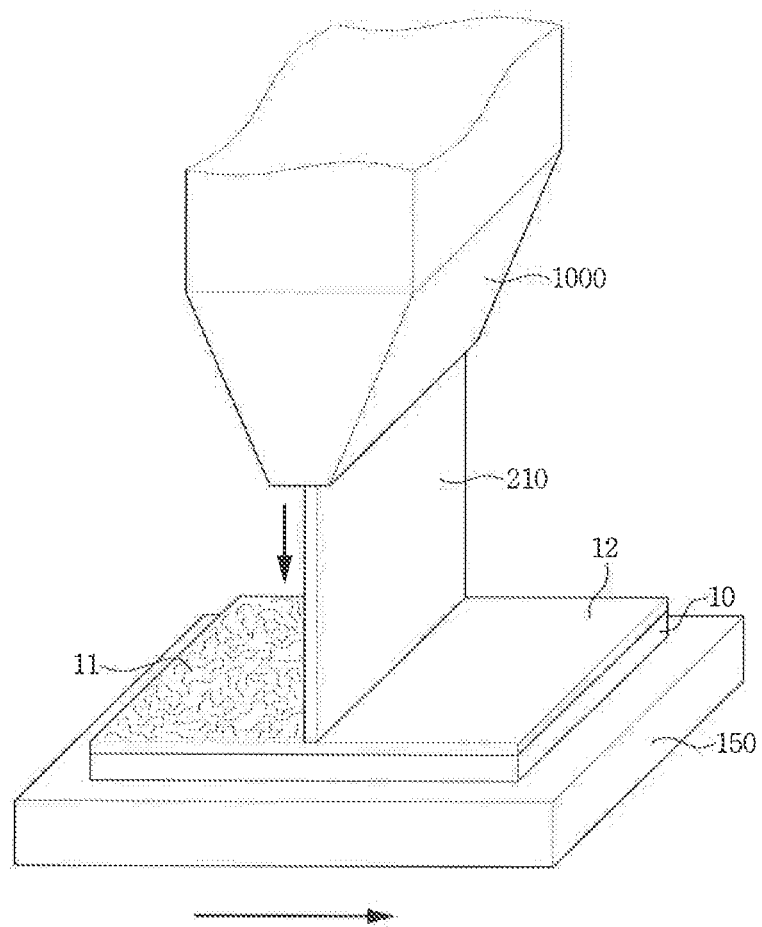
FIG. 1 is a schematic diagram illustrating laser crystallization of an amorphous silicon thin film according to an exemplary embodiment of the present invention.

Exemplary embodiments of the present invention will now be described more fully hereinafter with reference to the accompanying drawings. It is to be understood that the present invention may, however, be embodied in different forms and thus should not be construed as being limited to the exemplary embodiments set forth herein. Like reference numerals may refer to like elements throughout the specification.

Hereinafter, a laser polycrystallization apparatus according to an exemplary embodiment of the present invention will be described with reference to FIGS. 1, 2, 3, 4, 5 and 6.

FIG. 1 is a schematic diagram illustrating laser crystallization of an amorphous silicon thin film according to an exemplary embodiment of the present invention.

Referring to FIG. 1, a laser beam 210 is irradiated to an amorphous silicon thin film 11 located on a substrate 10 of a display device. The amorphous silicon thin film 11 is formed, using a silicon or a silicon-based material (e.g., SixGe1-x), to have a thickness in a range from about 25 nm to about 80 nm through a method such as a sputtering method, a reduced pressure CVD method, or a plasma CVD method. The substrate 10 on which the amorphous silicon thin film 11 is formed is placed on a moving tray 150. The moving tray 150 allows the substrate 10 to move at a substantially constant speed in a first direction (e.g., to the right) while the laser beam 210 is irradiated, so that the laser beam 210 may be irradiated to the amorphous silicon thin film 11 on the substrate 10 in a substantially uniform manner. The amorphous silicon thin film 11 irradiated with the laser beam 210 is crystallized into a polycrystalline silicon thin film 12. Crystallization of the amorphous silicon thin film 11 involves melting and re-crystallizing amorphous silicon by irradiating the laser beam 210 to the amorphous silicon for a few nanoseconds to raise a temperature of the amorphous silicon and then cooling the amorphous silicon.

The polycrystalline silicon, also called polysilicon (Po-Si), may be used in display devices such as an organic light emitting diode ("OLED") display device by virtue of its characteristics that a field-effect mobility (μFE) is hundreds of times higher than that of an amorphous silicon, and has excellent signal processing capabilities at a high frequency.

The laser beam 210 is output in the form of a quadrangle (e.g., a rectangle) to be uniformly irradiated onto the substrate 10 and to cover the width of the substrate 10. Herein, a long side direction of the rectangle is a major axis (e.g., a long axis), and a short side direction thereof is a minor axis (e.g., a short axis). An excimer laser, an yttrium aluminum garnet (YAG) laser, a glass laser, an yttrium orthovanadate (YVO4) laser, an Argon (Ar) laser, or the like may be used as a light source 200 (e.g., see FIG. 2) used in a laser polycrystallization apparatus 1000.

Figure 2:
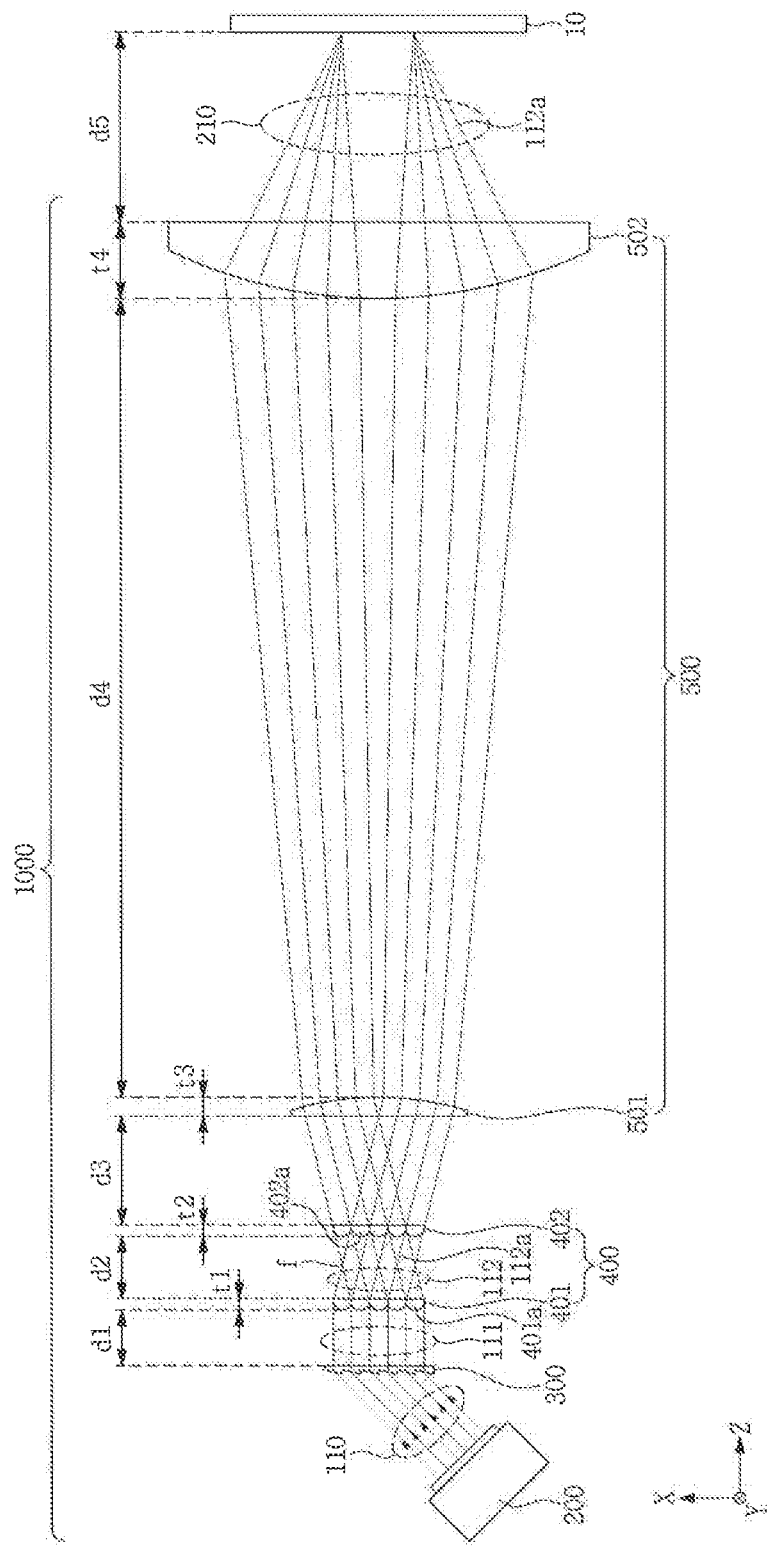
FIG. 2 is a view illustrating a laser polycrystallization apparatus according to an exemplary embodiment of the present invention.

FIG. 2 is a view illustrating a laser polycrystallization apparatus according to an exemplary embodiment of the present invention.

The laser polycrystallization apparatus 1000 according to an exemplary embodiment of the present invention includes a light source 200, a diffraction grating 300, a light split portion 400, and a light superposition portion 500, as illustrated in FIG. 2.

The light source 200 is a laser light source, which emits a laser beam 110. The laser beam 110 emitted from the light source 200 has an energy density of a Gaussian distribution. For example, a center energy density of the laser beam 110 is higher than an energy density of a peripheral portion of the laser beam 110.

The diffraction grating 300 receives the laser beam 110 from the light source 200, changes a path of the incident laser beam 110, and emits the laser beam 110 with the changed path. In the present exemplary embodiment, the diffraction grating 300 expands a size of the laser beam 110 in one direction and emits it. For example, the diffraction grating 300 expands the laser beam 110 in the major axis direction (e.g., an X-axis direction) or the minor axis direction (e.g., a Y-axis direction) to increase its magnification. The laser beam 111 of which magnification is increased is irradiated to the light split portion 400.

The light split portion 400 splits the laser beam 111 incident thereto from the diffraction grating 300 to generate a plurality of sub-laser beams 112a. In other words, the light split portion 400 generates a laser beam 112 including a plurality of sub-laser beams 112a. As an example, the light split portion 400 may include a first lens array 401 and a second lens array 402.

The first lens array 401 is located between the diffraction grating 300 and the light superposition portion 500. For example, the first lens array 401 is located between the diffraction grating 300 and the second lens array 402. The first lens array 401 may include a plurality of lenses 401a (hereinafter, "first lenses") to which the laser beam 111 is incident from the diffraction grating 300. Each first lens 401a may have a semi-cylindrical shape or a cylindrical shape. The plurality of first lenses 401a are located on an incidence surface of the first lens array 401. In other words, each of the first lenses 401a has a convex incidence surface. For example, the plurality of first lenses 401a may be located on a surface of the first lens array 401 that faces the diffraction grating 300, and the convex surface of each first lens 401a may face the diffraction grating 300. The plurality of first lenses 401a are arranged along the major axis direction (e.g., the X-axis direction).

For example, each of the first lenses 401a may be a spherical lens or an aspherical lens.

An emission surface of the first lens array 401 has a planar shape. In other words, each of the first lenses 401a has a flat emission surface from which the laser beam 112 is emitted from. The laser beam 111 incident to the first lens array 401 is refracted by each first lens 401a and divided into a plurality of sub-laser beams 112a. Each of the sub-laser beams 112a divided by the first lens array 401 is converged at a focus point f and then dispersed again to be incident to the second lens array 402.

The second lens array 402 is located between the first lens array 401 and the light superposition portion 500. For example, the second lens array 402 is located between the first lens array 401 and a first condensing lens 501. The second lens array 402 may include a plurality of lenses 402a (hereinafter, "second lenses") to which the laser beam 112 is incident from the first lens array 401. Each second lens 402a may have a semi-cylindrical shape or a cylindrical shape. The plurality of second lenses 402a are located on an incidence surface, facing the first lens array 401, of the second lens array 402. In other words, each of the second lenses 402a has a convex incidence surface. For example, the convex surface of each second lens 402a may face the first lens array 401. The plurality of second lenses 402a are arranged along the major axis direction (e.g., the X-axis direction). The number of second lenses 402a included in the second lens array 402 may be substantially equal to the number of first lenses 401a included in the first lens array 401.

For example, each of the second lenses 402a may be a spherical lens or an aspherical lens.

An emission surface of the second lens array 402 has a planar shape. In other words, each of the second lenses 402a has a flat emission surface. The laser beam 112 incident to the second lens array 402 is refracted by each second lens 402a and emitted to the light superposition portion 500.

The light superposition portion 500 superposes the sub-laser beams 112a, which are incident thereto, split by the light split portion 400 and emits them. In other words, the light superposition portion 500 receives the laser beam 112 from the second lens array 402, superposes the plurality of sub-laser beams 112a included in the irradiated laser beam 112, and emits the superposed sub-laser beams 112a.

The light superposition portion 500 may include at least one condensing lens. For example, as illustrated in FIG. 2, the light superposition portion 500 may include a first condensing lens 501 and a second condensing lens 502.

The first condensing lens 501 is located between the light split portion 400 and the substrate 10. For example, the first condensing lens 501 is located between the second lens array 402 and the second condensing lens 502.

The second condensing lens 502 is located between the first condensing lens 501 and the substrate 10.

The first condensing lens 501 has a flat incidence surface and a convex emission surface, and the second condensing lens 502 has a convex incidence surface and a flat emission surface. In other words, the convex surface of the first condensing lens 501 and the convex surface of the second condensing lens 502 face each other.

The first condensing lens 501 refracts and diffuses the sub-laser beams 112a in the major axis direction (e.g., the X-axis direction), and emits them. The sub-laser beams 112a emitted from the first condensing lens 501 are received by the second condensing lens 502 in which the sub-laser beams 112a are refracted and emitted. The sub-laser beams 112a emitted from the second condensing lens 502 have a uniform energy density in the major axis direction (e.g., the X-axis direction). The sub-laser beams 112a having passed through the second condensing lens 502 are irradiated to the substrate 10. In other words, the laser beam 210 having passed through the second condensing lens 502 includes a plurality of sub-laser beams 112a, and such a laser beam 210 is irradiated to the substrate 10. For example, while being irradiated to the substrate 10, the plurality of sub-laser beams 112a may be focused on points of the substrate 10.

As illustrated in FIG. 2, a distance d1 between the diffraction grating 300 and the first lens array 401 may be in a range from about 100 mm to about 1,000 mm. For example, the distance d1 between the emission surface of the diffraction grating 300 and the incidence surface of the first lens array 401 may be in a range from about 100 mm to about 1,000 mm.

A distance d2 between the first lens array 401 and the second lens array 402 may be about 135 mm. For example, the distance d2 between the emission surface of the first lens array 401 and the incidence surface of the second lens array 402 may be about 135 mm.

A distance d3 between the second lens array 402 and the first condensing lens 501 may be about 323 mm. For example, the distance d3 between the emission surface of the second lens array 402 and the incidence surface of the first condensing lens 501 may be about 323 mm.

A distance d4 between the first condensing lens 501 and the second condensing lens 502 may be about 14,000 mm. For example, the distance d4 between the emission surface of the first condensing lens 501 and the incidence surface of the second condensing lens 502 may be about 14,000 mm.

A distance d5 between the second condensing lens 502 and the substrate 10 may be about 500 mm. For example, the distance d5 between the emission surface of the second condensing lens 502 and an irradiation surface of the substrate 10 may be about 500 mm.

In addition, as illustrated in FIG. 2, a thickness t1 of the first lens 401a included in the first lens array 401 may be about 3 mm, and a radius of curvature of the first lens 401a included in the first lens array 401 may be about 110.8 mm.

A thickness t2 of the second lens 402a included in the second lens array 402 may be about 3 mm, and a radius of curvature of the second lens 402a included in the second lens array 402 may be about 25.7 mm.

A thickness t3 of the first condensing lens 501 may be about 40 mm, and a radius of curvature of the first condensing lens 501 may be about 6,822 mm.

A thickness t4 of the second condensing lens 502 may be about 50 mm, and a radius of curvature of the second condensing lens 502 may be about 6,822 mm.

At least one of the diffraction grating 300, the first lens array 401, the second lens array 402, the first condensing lens 501, and the second condensing lens 502 may include a material including fused silica.

In an exemplary embodiment of the present invention, an air layer may be positioned between the first lens array 401 and the second lens array 402, between the second lens array 402 and the first condensing lens 501, and between the first condensing lens 501 and the second condensing lens 502.

Figure 3:
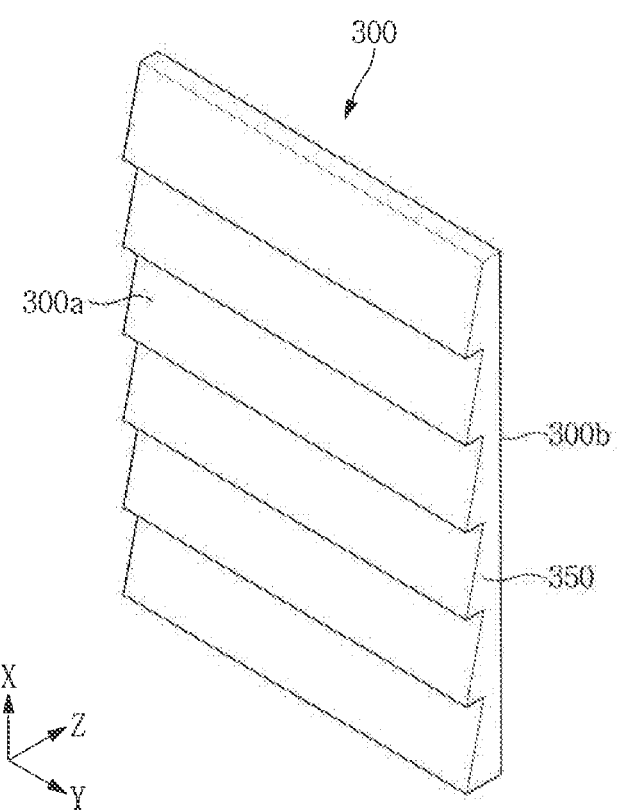
FIG. 3 is a perspective view illustrating a diffraction grating of FIG. 2 according to an exemplary embodiment of the present invention.
Figure 4:
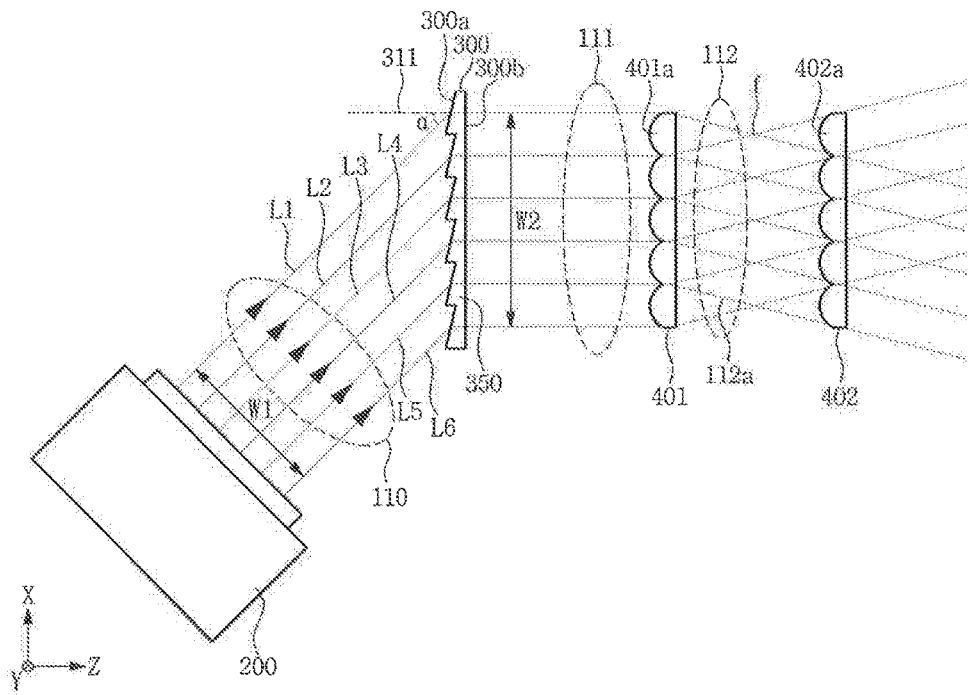
FIG. 4 is a view enlarging a light source, a diffraction grating, a first lens array and a second lens array of FIG. 2 according to an exemplary embodiment of the present invention.
Figure 5:
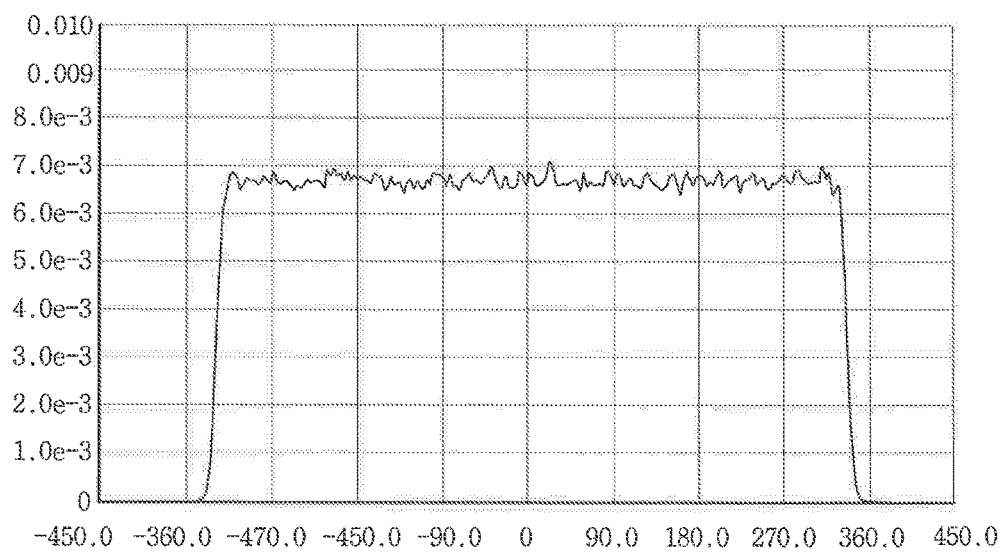
FIG. 5 is a view illustrating an intensity in a major axis direction of a laser beam emitted from a light superposition portion of FIG. 2 according to an exemplary embodiment of the present invention.

FIG. 3 is a perspective view illustrating a diffraction grating of FIG. 2 according to an exemplary embodiment of the present invention, FIG. 4 is a view enlarging a light source, a diffraction grating, a first lens array and a second lens array of FIG. 2 according to an exemplary embodiment of the present invention, and FIG. 5 is a view illustrating an intensity in a major axis direction of a laser beam emitted from a light superposition portion of FIG. 2 according to an exemplary embodiment of the present invention. An abscissa axis of FIG. 5 represents a cross-section of the laser beam, and an ordinate axis of FIG. 5 represents an intensity of the laser beam.

As illustrated in FIG. 3, the diffraction grating 300 includes a plurality of gratings 350 arranged along the major axis direction (e.g., the X-axis direction). Each grating 350 may have a triangular shape from a cross-sectional view. For example, each grating 350 may be slanted at an angle with respect to an emission surface 300b of the diffraction grating 300. As an additional example, a bottom surface of each grating 350 extends in a direction away from the emission surface 300b of the diffraction grating 300. In addition, as illustrated in FIG. 4, a bottom surface of each grating 350 included in the diffraction grating 300 faces downward (e.g., a negative X-direction).

In an exemplary embodiment of the present invention, the diffraction grating 300 may include gratings 350 with a rectangular shape. However, the present invention is not limited thereto.

As illustrated in FIG. 4, an angle α (hereinafter, "an incidence angle") between the laser beam 110, which is irradiated from the light source 200 to an incidence surface 300a of the diffraction grating 300, and a normal line 311 of the emission surface 300b of the diffraction grating 300 is an acute angle. For example, the incidence angle α may be in a range from about 5 degrees to about 65 degrees. For example, the incidence angle may be about 45 degrees. As an additional example, the normal line 311 may be an imaginary line that extends perpendicular to the emission surface 300b of the diffraction grating 300.

The laser beam 111 having passed through the diffraction grating 300 has a size larger than a size of the laser beam 110 before passing through the diffraction grating 300 due to the incidence angle α of the laser beam 110. In other words, a magnification of the laser beam 111 passing through the diffraction grating 300 increases. For example, as illustrated in FIG. 4, the laser beam 111 having passed through the diffraction grating 300 has a width W2 which is larger in the major axis direction (e.g., the X-axis direction) than a width W1 of the laser beam 110 emitted from the light source 200 (e.g., W2>W1). In other words, the width W2 of the laser beam 111 having passed through the diffraction grating 300 is larger than the width W1 of the laser beam 110 before passing through the diffraction grating 300. Since the size of the laser beam 111 passing through the diffraction grating 300 increases in such a manner, the magnification of the laser beam 111 may increase without using a plurality of telescope lenses. Accordingly, the structure of the laser polycrystallization apparatus 1000 may be simplified.

The diffraction grating 300 may have a diffraction angle of about 0 degrees. Herein, the diffraction angle is an angle formed by the normal line 311 of the diffraction grating 300 and the laser beam 111 emitted from the diffraction grating 300.

The diffraction grating 300 may function with light having a wavelength of about 343 nm. In other words, the diffraction grating 300 may have a working wavelength of 343 nm.

The laser beam 110 emitted from the light source 200 may include a plurality of sub-beams L1, L2, L3, L4, L5 and L6, as illustrated in FIG. 4. The sub-beams L1, L2, L3, L4, L5 and L6 are parallel to each other. The sub-beams L1, L2, L3, L4, L5 and L6 are incident to the incidence surface 300a of the diffraction grating 300 at the aforementioned incidence angle α. Accordingly, each of the sub-beams L1, L2, L3, L4, L5 and L6 incident to the incidence surface 300a of the diffraction grating 300 has optical paths of different lengths. For example, a sub-beam L1 of the sub-beams L1, L2, L3, L4, L5 and L6 which is incident to an uppermost portion of the incidence surface 300a of the diffraction grating 300 has a longest optical path, and a sub-beam L6 of the sub-beams L1, L2, L3, L4, L5 and L6 which is incident to a lowermost portion of the incidence surface 300a of the diffraction grating 300 has a shortest optical path. In other words, the closer a sub-beam is incident to an upper portion of the diffraction grating 300, the longer the optical path will be for that sub-beam. Due to the difference in the lengths of the optical paths, a phase delay occurs between the sub-beams L1, L2, L3, L4, L5 and L6, such that a coherence between the sub-beams L1, L2, L3, L4, L5 and L6 may be substantially minimized. Accordingly, a speckle noise of the laser beam 210 incident to the substrate 10 may be substantially minimized.

In an exemplary embodiment of the present invention, as described above, the laser beam 110 emitted from the light source 200 has an energy density of a Gaussian distribution. For example, an energy density of the sub-beams L3 and L4 located at a center portion of the laser beam 110 is relatively high, and an energy density of the sub-beams L1, L2, L5, and L6 located at a peripheral portion of the laser beam is relatively low.

The diffraction grating 300 may be a blazed refraction grating or a blazed transmission grating which may achieve a maximum efficiency of the diffraction grating 300 at a specific diffraction order or a specific spectrum order. In the case where such a diffraction grating 300 is used, most of the optical power may achieve a maximum efficiency of the diffraction grating 300 at a specific diffraction order, and light output loss may be substantially minimized in other diffraction orders. For example, this loss may be nearly zero. Such a diffraction grating 300 may operate at a specific wavelength length, for example, a blaze wavelength.

A lattice equation of the diffraction grating 300 may be denoted by the following equation (Equation 1).

$$d(\sin \alpha + \sin \beta) = m\lambda \qquad \text{<Equation 1>}$$

In Equation 1, d represents a lattice constant, α represents an incidence angle, β represents a diffraction angle, m represents a diffraction order, and λ represents a wavelength of an incident light (e.g., a light incident from the light source 200 to the incidence surface 300a of the diffraction grating 300).

A geometry grating magnification M of the diffraction grating 300 illustrated in FIG. 4 may be calculated by the following equation (Equation 2).

$$M = 1/\cos \alpha \qquad \text{<Equation 2>}$$

A phase delay of the sub-beams L1, L2, L3, L4, L5 and L6 passing through adjacent first lenses 401a of the first lens array 401 may be determined by the following equation (Equation 3).

$$\Delta = P_{LA} * \sin \alpha \qquad \text{<Equation 3>}$$

In Equation 3, $P_{LA}$ represents a pitch of the first lens 401a (or the second lens 402a).

When the laser beam 110 from the light source 200 has a wavelength of about 343 nm and a spectral bandwidth of about 0.1 nm, a spatial coherence length L may be given by Equation 4 below.

$$L = \sqrt{\frac{2\ln(2)}{\pi n}} \frac{\lambda^2}{\Delta \lambda} \qquad \text{<Equation 4>}$$

In Equation 4, the spatial coherence length L may be about 7.8 mm.

The incidence angle α of the aforementioned diffraction grating 300 may be about 45 degrees and the diffraction angle β of the diffraction grating 300 may be about 0 degrees. In the present exemplary embodiment of the present invention, when the diffraction order m of Equation 1 is 1, the lattice constant d may be about 485 um. In addition, as shown in Equation 3, the phase delay between sub-beams having the pitch $P_{LA}$ of about 8 mm may be about 11.3 mm. This value is larger than the coherence length of about 7.8 mm. Accordingly, the distribution of the laser beam 210 irradiated to the substrate 10 might not be affected by interference effects. In other words, the laser beam 210 irradiated to the substrate 10 may have an intensity homogenized in the major axis direction (e.g., the X-axis direction), as illustrated in FIG. 5. In an exemplary embodiment of the present invention, the magnification M in the Equation 2 may be about 1.4.

Figure 6:
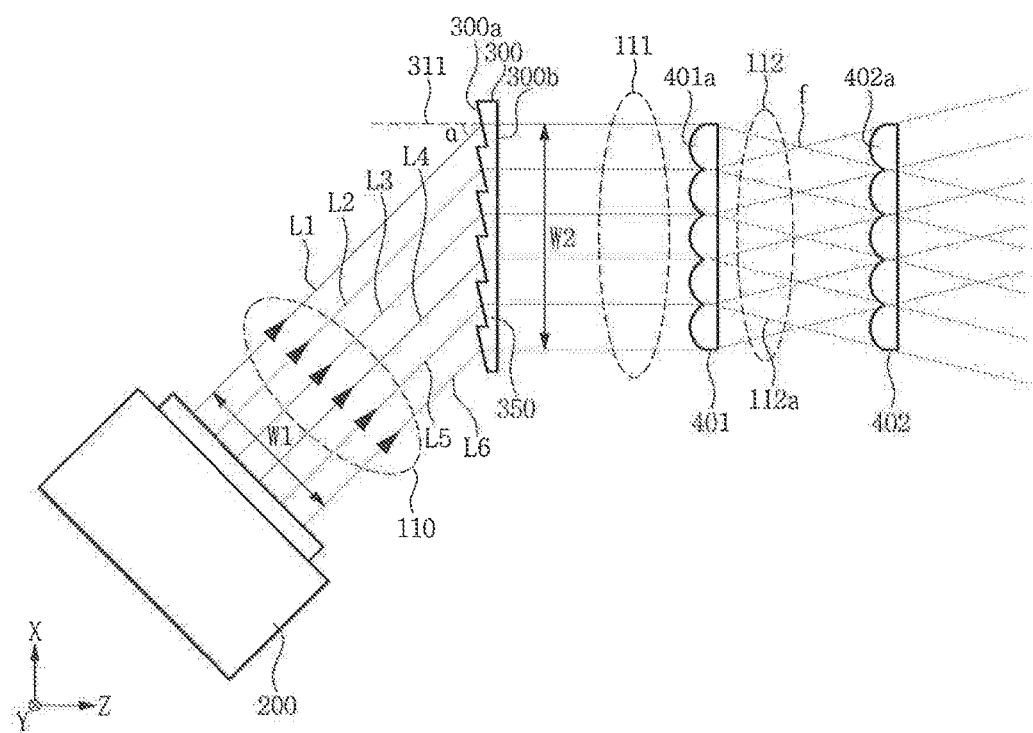
FIG. 6 is a view enlarging the light source, the diffraction grating, the first lens array and the second lens array of FIG. 2 according to an exemplary embodiment of the present invention.

FIG. 6 is a view enlarging the light source, the diffraction grating, the first lens array and the second lens array of FIG. 2 according to an exemplary embodiment of the present invention.

As illustrated in FIG. 6, a bottom surface of a grating 350 included in a diffraction grating 300 faces upward (e.g., the X-direction). In other words, while the bottom surface of the grating 350 included in the diffraction grating 300 of FIG. 4 faces downward, the bottom surface of the grating 350 included in the diffraction grating 300 of FIG. 6 faces upward.

As set forth hereinabove, according to an exemplary embodiment of the present invention, the laser polycrystallization apparatus provides the following effects.

First, a laser beam from a light source is incident on a diffraction grating at an acute angle. Accordingly, each sub-beam of the laser beam incident to the diffraction grating has an optical path of a different length. Due to the difference in the lengths of the optical paths, a phase delay is generated between the sub-beams, and accordingly, a coherence between the sub-beams may be substantially minimized. Therefore, the speckle noise of the laser beam incident to the substrate may be substantially minimized.

Second, due to the above described incidence angle, a size of the laser beam passing through the diffraction grating increases. Accordingly, a magnification of the laser beam may be increased without a plurality of telescope lenses. Therefore, the configuration of the laser polycrystallization apparatus may be substantially simplified.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A laser polycrystallization apparatus, comprising:
a light source for emitting a laser beam including a plurality of sub-beams;
a diffraction grating for receiving the laser beam from the light source, changing a path and a magnitude of the received laser beam, and outputting the changed laser beam;
a light split portion for splitting the laser beam received from the diffraction grating; and
a light superposition portion for superposing the split laser beams received from the light split portion and irradiating the superposed split laser beams to a substrate,
wherein an angle between the laser beam irradiated to an incidence surface of the diffraction grating from the light source and a line substantially perpendicular to an emission surface of the diffraction grating is an acute angle, wherein the plurality of sub-beams are incident to the incidence surface at a same angle as one another.

2. The laser polycrystallization apparatus of claim 1, wherein the angle is about 5 degrees to about 65 degrees.

3. The laser polycrystallization apparatus of claim 1, wherein a diffraction angle of the diffraction grating is about 0 degrees.

4. The laser polycrystallization apparatus of claim 1, wherein the light split portion comprises:
a first lens array located between the diffraction grating and the light superposition portion and comprising a plurality of first lenses, each of the first lenses having a semi-cylindrical shape; and
a second lens array located between the first lens array and the light superposition portion and comprising a plurality of second lenses, each of the second lenses having a semi-cylindrical shape.

5. The laser polycrystallization apparatus of claim 1, wherein the light superposition portion comprises at least one condensing lens.

6. The laser polycrystallization apparatus of claim 1, wherein the light superposition portion comprises:
a first condensing lens located between the light split portion and the substrate; and
a second condensing lens located between the first condensing lens and the substrate.

7. The laser polycrystallization apparatus of claim 1, wherein the diffraction grating is a blazed transmission grating.

8. The laser polycrystallization apparatus of claim 1, wherein the plurality of sub-beams includes a first sub-beam and a second sub-beam, wherein the first sub-beam is incident to an uppermost portion of the incidence surface, and the second sub-beam is incident to a lowermost portion of the incidence surface, Wherein an optical path of the first sub-beam has a length different from that of an optical path of the second sub-beam.

9. The laser polycrystallization apparatus of claim 4, wherein a distance between the diffraction grating and the first lens array is about 100 mm to about 1000 mm.

10. The laser polycrystallization apparatus of claim 4, wherein a distance between the first lens array and the second lens array is about 135 mm.

11. The laser polycrystallization apparatus of claim 4, wherein a first lens of the plurality of first lenses has a thickness of about 3 mm and a radius of curvature of about 110.8 mm.

12. The laser polycrystallization apparatus of claim 4, wherein a second lens of the plurality of second lenses has a thickness of about 3 mm and a radius of curvature of about 25.7 mm.

13. The laser polycrystallization apparatus of claim 4, wherein the first lens array, the second lens array, or the diffraction grating comprises fused silica.

14. The laser polycrystallization apparatus of claim 6, wherein an emission surface of the first condensing lens and an incidence surface of the second condensing lens are convex.

15. The laser polycrystallization apparatus of claim 6, wherein a distance between the first condensing lens and the second condensing lens is about 14,000 mm.

16. The laser polycrystallization apparatus of claim 6, wherein a distance between the second condensing lens and the substrate is about 500 mm.

17. The laser polycrystallization apparatus of claim 6, wherein the first condensing lens has a thickness of about 40 mm and a radius of curvature of about 6,822 mm.

18. The laser polycrystallization apparatus of claim 6, wherein the second condensing lens has a thickness of about 50 mm and a radius of curvature of about 6,822 mm.

19. The laser polycrystallization apparatus of claim 6, wherein the first condensing lens or the second condensing lens comprises fused silica.

20. A laser polycrystallization apparatus, comprising:
a light source for emitting a laser beam;
a diffraction grating for receiving the laser beam from the light source, changing a path and a magnitude of the received laser beam, and outputting the changed laser beam;
a light split portion for splitting the laser beam received from the diffraction grating; and a light superposition for superposing the split laser beams received from the light split portion and irradiating the superposed split laser beams to a substrate, wherein an angle between the laser beam irradiated to an incidence surface of the diffraction grating from the light source and a line substantially perpendicular to an emission surface of the diffraction grating is an acute angle, wherein a wavelength of the laser beam emitted from the light source is about 343 nm.

21. A laser polycrystallization apparatus, comprising:
a light source;
a diffraction grating including a plurality of gratings, each grating having a triangular shape;
a first lens array including a plurality of first lenses;
a second lens array including a plurality of second lenses, wherein the first lens array is disposed between the second lens array and the diffraction grating;
a first condensing lens including an emission surface with a convex shape; and
a second condensing lens including an incidence surface with a convex shape, wherein the incidence surface of the second condensing lens faces the emission surface of the first condensing lens.

22. The laser polycrystallization apparatus of claim 21, wherein each first lens of the plurality of first lenses has a first radius of curvature, and each second lens of the plurality of second lenses has a second radius of curvature, wherein the first radius of curvature is larger than the second radius of curvature.

* * * * *